US012355410B2

(12) United States Patent
Michel

(10) Patent No.: US 12,355,410 B2
(45) Date of Patent: Jul. 8, 2025

(54) TRANSCONDUCTANCE TUNING IN PHOTON COUNTING

(71) Applicant: ams International AG, Jona (CH)

(72) Inventor: Fridolin Michel, Au (CH)

(73) Assignee: AMS INTERNATIONAL AG, Jona (CH)

( * ) Notice: Subject to any disclaimer, the term of this patent is extended or adjusted under 35 U.S.C. 154(b) by 204 days.

(21) Appl. No.: 18/246,230

(22) PCT Filed: Aug. 27, 2021

(86) PCT No.: PCT/EP2021/073754
§ 371 (c)(1),
(2) Date: Mar. 22, 2023

(87) PCT Pub. No.: WO2022/069122
PCT Pub. Date: Apr. 7, 2022

(65) Prior Publication Data
US 2023/0361736 A1    Nov. 9, 2023

(30) Foreign Application Priority Data
Sep. 29, 2020  (EP) .................................. 20198990

(51) Int. Cl.
*H03F 3/45*      (2006.01)
*G01J 3/28*      (2006.01)
(Continued)

(52) U.S. Cl.
CPC ........ *H03F 3/45475* (2013.01); *G01J 3/2823* (2013.01); *H04N 25/60* (2023.01);
(Continued)

(58) Field of Classification Search
CPC ........... H03F 3/45475; H03F 2200/144; H03F 2200/546; H03F 2203/45116;
(Continued)

(56) References Cited

U.S. PATENT DOCUMENTS 5,465,072 A * 11/1995 Atarodi ................ H03G 1/0023
330/311
5,578,965 A * 11/1996 Kimura .................. G06G 7/164
330/253

(Continued)

OTHER PUBLICATIONS

Analog Devices, Linear Design Seminar (1987)—III. Operational Amplifiers, Oct. 1987 (Year: 1987).*

(Continued)

*Primary Examiner* — Timothy J Henn
(74) *Attorney, Agent, or Firm* — MH2 Technology Law Group LLP

(57) ABSTRACT

A circuit arrangement is provided which includes an array of stages for photon counting current to voltage conversion. Each stage includes a tunable operational transconductance amplifier and a feedback network forming a feedback loop of the operational transconductance amplifier. Each stage is configured to provide an output signal as a function of an input signal that is provided to the amplifier input of the operational transconductance amplifier, wherein the input signal comprises one or more current pulses and the output signal comprises one or more voltage pulses. With the tunable operational transconductance amplifier the transconductance of a stage can be tuned so that differences in peaking time and gain are avoided. Furthermore, an imaging device and a method for operating a circuit arrangement are provided.

14 Claims, 6 Drawing Sheets

(51) Int. Cl.
*H04N 25/60* (2023.01)
*H04N 25/709* (2023.01)

(52) U.S. Cl.
CPC .... *H04N 25/709* (2023.01); *G01J 2003/2826* (2013.01); *H03F 2200/144* (2013.01); *H03F 2200/546* (2013.01); *H03F 2203/45116* (2013.01); *H03F 2203/45546* (2013.01); *H03F 2203/45601* (2013.01)

(58) Field of Classification Search
CPC . H03F 2203/45546; H03F 2203/45601; H03F 2200/36; H03F 2203/45048; H03F 3/70; H03F 3/72; H03F 2200/213; H03F 2200/231; H03F 2200/312; H03F 2200/396; H03F 2200/45; H03F 2200/54; H03F 2203/45512; H03F 2203/45526; H03F 2203/45528; H03F 2203/45544; H03F 2203/45548; H03F 2203/45592; H03F 2203/45618; H03F 2203/45631; H03F 2203/45632; H03F 2203/45698; H03F 2203/45712; H03F 2203/45728; H03F 2203/7215; H03F 2203/7221; H03F 2203/7236; H03F 3/08; H03F 1/083; H03F 2200/78; G01J 3/2823; G01J 2003/2826; H04N 25/60; H04N 25/709; H03G 3/3084
See application file for complete search history.

(56) References Cited

U.S. PATENT DOCUMENTS

| | | | |
|---|---|---|---|
| 5,864,416 A | 1/1999 | Williams | |
| 6,404,277 B1* | 6/2002 | Lee | H04B 1/28 327/552 |
| 2005/0146316 A1* | 7/2005 | Kim | G05F 3/262 323/316 |
| 2009/0128216 A1* | 5/2009 | Rao | A61B 6/037 327/345 |
| 2009/0137220 A1* | 5/2009 | Kim | H03F 3/45475 330/277 |
| 2013/0256542 A1* | 10/2013 | Soh | G01T 1/247 250/370.08 |
| 2014/0332671 A1* | 11/2014 | Lee | H03F 3/08 250/214 A |
| 2016/0299002 A1 | 10/2016 | Steadman et al. | |
| 2018/0372887 A1* | 12/2018 | Goederer | H10F 39/811 |

OTHER PUBLICATIONS

Wikipedia—Operational transconductance amplifier, retrieved from https://en.wikipedia.org/wiki/Operational_transconductance_amplifier on Dec. 15, 2024 (Year: 2024).*
Wienema, D. (Authorized Officer), International Search Report and Written Opinion dated Oct. 8, 2021, PCT Application No. PCT/EP2021/073754, 12 pages.

* cited by examiner ered, so in each case the dependent claims really…

TRANSCONDUCTANCE TUNING IN PHOTON COUNTING

CROSS-REFERENCE TO RELATED APPLICATIONS

The present application is the national stage entry of International Patent Application No. PCT/EP2021/073754, filed on Aug. 27, 2021, and published as WO 2021/069122 A1 on Apr. 7, 2022, which claims priority to EP Application Serial No. 20198990.2, filed on Sep. 29, 2020, the disclosures of all of which are incorporated by reference herein in their entireties.

FIELD OF THE INVENTION

The present application relates to a circuit arrangement, an imaging device and a method for operating a circuit arrangement.

BACKGROUND OF THE INVENTION

In photon counting systems single photon events are detected. For this purpose, the energy of single photons is converted into a current pulse, respectively. These current pulses are converted into voltage pulses by a frontend circuit. The height of a voltage pulse is proportional to the respective photon energy. Thus, the voltage pulses contain spectral information. In order to achieve a high spatial resolution a large number of channels for photon counting can be employed. In this case, sufficient cooling for the whole system is required, as the power consumption increases with the number of channels. For large systems the cooling can become expensive.

Furthermore, in many cases the sensor and the frontend circuit are not integrated with each other, thus it is necessary to connect them with each other. The connections between the sensor and the frontend circuit can introduce parasitic input capacitances. These have a direct impact on the noise behavior and the speed of the frontend circuit and can considerably increase the power consumption.

In addition, the connections between the sensor and the frontend circuit usually do not have the same length for all channels. This leads to different input capacitances for the different channels. Because of the impact of the input capacitance on performance parameters of the frontend circuit, different input capacitances lead to different performance parameters as shaping time, gain and noise for different channels which leads to image artefacts.

One possibility to avoid these problems is to employ through silicon vias to direct power and input-output lines to the silicon backside. The top surface is designed to match the sensor dimensions. In this way, a direct connection of the sensor with the frontend circuit is enabled. This results in small and uniform input capacitances. However, this technology is expensive and the dimensions of the frontend circuit have to match with the dimensions of the sensor. This increases the area of the frontend circuit and thus the cost. Furthermore, for different sensors different die sizes would be required, which is why an application-specific integrated circuit (ASIC) would be required and a standard product design would not be possible.

In US20180372887 A1 a radiation detector is described where the frontend circuit comprises a plurality of evaluation elements. For each evaluation element a tunable feedback element with for example an adjustable capacitor is connected to an amplifier element. The capacitance of the feedback element is adjusted in such a way that for each evaluation element the sum of the respective input capacitances is the same value. In this way, the differences of the input capacitances are balanced. However, in this way the power consumption is increased as the sum of the capacitances must equal the worst input capacitance to achieve uniformity. Furthermore, additional non-ideality can be introduced by the feedback elements at the inputs of the amplifier elements.

It is an objective to provide a circuit arrangement that can be operated efficiently. It is further an objective to provide an imaging device that can be operated efficiently. It is further an objective to provide an efficient method for operating a circuit arrangement.

These objectives are achieved by the subject matter of the independent claims. Further developments and embodiments are described in dependent claims.

SUMMARY OF THE INVENTION

According to at least one embodiment of the circuit arrangement, the circuit arrangement comprises an array of stages for photon counting current to voltage conversion. Each of the stages is configured for photon counting current to voltage conversion. For example, each stage is connected with one pixel of a photon detector, respectively. Each stage is configured to convert a current into a voltage. The current can be a current pulse received from a photon detector. The stages of the array can be arranged parallel to each other. This can mean, that the stages of the array are connected parallel to each other. The array of stages comprises a plurality of stages for photon counting current to voltage conversion.

Each stage comprises a tunable operational transconductance amplifier (OTA) comprising an amplifier input and an output. That the OTA is tunable can mean, that the transconductance of the OTA can be tuned or adjusted, for example during operation. For this purpose the OTA can comprise a control input. At the control input a control voltage can be applied in order to tune the transconductance of the OTA. The amplifier input can be a negative input and a further input of the OTA can be a positive input. The OTA can be configured to provide a voltage at its output. The OTA can also be configured to convert a current pulse into a voltage pulse.

Each stage further comprises a feedback network that is connected to the amplifier input and to the output of the OTA thereby forming a feedback loop of the OTA. The feedback network can comprise one or more components. The components of the feedback network can be connected parallel to each other. For example, the feedback network comprises a feedback capacitor. The feedback capacitor can be connected to the amplifier input and to the output of the OTA. The feedback network can also comprise a transconductance feedback element which can be a transconductor or a resistor. The transconductance feedback element can be connected to the amplifier input and to the output of the OTA. Thus, the feedback capacitor and the transconductance feedback element can be connected parallel to each other. The feedback loop can be configured to provide feedback from the output of the OTA to the amplifier input.

Each stage is configured to provide an output signal as a function of an input signal that is provided to the amplifier input of the OTA, wherein the input signal comprises one or more current pulses and the output signal comprises one or more voltage pulses. This means, during operation of the circuit arrangement for each stage an input signal is provided to the amplifier input of the OTA. Each input signal comprises one or more current pulses, where each current pulse can be provided by a photon detector. Each current pulse can relate to the detection of one photon. For each current pulse of the input signal the respective output signal can comprise a voltage pulse. This means, each stage is configured to convert a current pulse into a voltage pulse.

When the circuit arrangement is connected with an external component from which it receives the input signals parasitic input capacitances can be introduced for the stages of the array of stages. In many cases the input capacitances are different for the different stages of the array. This can be caused by different lengths of the connections between the external component and the different stages. The respective input capacitances have an impact on the performance of the respective stage, such as peaking time, gain, speed and noise.

For each stage the bandwidth of the stage is inversely proportional to the respective input capacitance. The bandwidth of a stage has impact on the peaking time and the gain of the respective stage. The peaking time and the gain are performance parameters of the respective stage. The peaking time is the length of the voltage pulse provided by the respective OTA. Thus, the performance parameters peaking time and gain are different for the stages with different input capacitances. Different performance parameters for different stages are not desired as they can in the case of imaging lead to image artefacts.

The circuit arrangement comprises a tunable OTA since the bandwidth of a stage is proportional to the transconductance of the respective stage. This means, with the circuit arrangement the transconductance of the different stages can be tuned in such a way that the bandwidth is the same or approximately the same for all stages. The transconductance of each stage is tuned by tuning the transconductance of the respective OTA. This means, the differences of the input capacitances can be balanced by tuning the transconductance for each stage. In this way, the performance of the different stages is equalized.

The input capacitance can be determined for each stage in a calibration step. Afterwards, the transconductance of the OTA is tuned based on the determined input capacitances.

Tuning of the transconductance of the tunable OTAs enables that each stage is operated at its minimum power consumption.

Consequently, the circuit arrangement has the advantages that the performance of the different stages can be equalized and that each stage can be operated at its minimum power consumption. This means, the circuit arrangement can be operated efficiently. Furthermore, the cooling can be cost efficient if the power consumption is decreased.

According to at least one embodiment of the circuit arrangement, for each stage a noise injection block is connected to a further input of the OTA. This means, the circuit arrangement comprises a plurality of noise injection blocks, where for each stage one noise injection block is connected to the OTA, respectively. Each noise injection block is configured to inject or add noise to the respective OTA. With the noise injection block the noise level can be adjusted for each stage separately. The noise level of a stage is independent of the transconductance. However, the noise power of a stage is proportional to the respective input capacitance. Thus, the noise can be different for different stages if they have different input capacitances. By tuning the transconductance of an OTA differences in the noise level cannot be balanced. Thus, for each stage a noise injection block is employed. The noise injected by the noise injection blocks depends on the input capacitance of the respective stage. This means, for each stage an amount of noise is injected or added in such a way that the noise level is the same or approximately the same for all stages. Thus, noise is injected in such a way that the noise level of each stage equals or is approximately equal to the highest noise level of all stages. The amount of the injected noise for each stage depends on the respective input capacitance. In this way, the same or a similar noise level for all stages is achieved. This is advantageous for the image quality when the circuit arrangement is employed for imaging.

According to at least one embodiment of the circuit arrangement, each noise injection block comprises a buffer component with tunable noise level that is arranged between a reference potential terminal and the further input of the respective OTA. This means, for each stage the buffer component is connected to the reference potential terminal and to the further input of the respective OTA. That the buffer component has a tunable noise level can mean that the noise level of the buffer component can be adjusted. Thus, the buffer component can be employed to inject noise to the respective OTA. In this way, advantageously the noise level can be adjusted to be the same or approximately the same for all stages.

According to at least one embodiment of the circuit arrangement, each noise injection block comprises a tunable capacitor that is connected to a first internal node arranged between the buffer component and the further input of the respective OTA. The first internal node is connected to the buffer component, to the further input of the OTA and to the tunable capacitor. The capacitance of the tunable capacitor can be tuned or adjusted. The noise injected by a noise injection block is the intrinsic noise of the respective buffer component. The level of this intrinsic noise can be adjusted by tuning the transconductance of the buffer component or by tuning the capacitance of the tunable capacitor. In this way, advantageously the noise level can be adjusted to be the same or approximately the same for all stages.

According to at least one embodiment of the circuit arrangement, the circuit arrangement further comprises a plurality of heaters, where each heater is assigned to one of the stages, respectively. This means to each of the stages one of the heaters is assigned. The heaters can be arranged in close proximity or adjacent to the respective stages. It is further possible that the heaters are mechanically connected with the respective stages. Each heater is configured to heat its environment. The heaters are employed to equalize the heat distribution within the circuit arrangement. For each stage the power consumption during operation can be different. Therefore, the stages have different temperatures during operation. The heaters are employed to introduce additional heat for the stages with a lower power consumption. The heaters can be operated in such a way that the temperature in the surroundings of each stage is the same or approximately the same. For this purpose, the heaters are operated in such a way that they increase the temperature in dependence of the power consumption of the assigned stage. A uniform heat distribution within the circuit arrangement is advantageous for an efficient cooling and a uniform performance of the stages.

According to at least one embodiment of the circuit arrangement, for each stage the tunable OTA is configured to be supplied with a control voltage, where by changing the control voltage the transconductance of the respective OTA can be tuned. The control voltage can be supplied to the control input of the OTA. Tuning of the transconductance of the OTAs advantageously enables an equalization of the performance parameters of the different stages.

According to at least one embodiment of the circuit arrangement, for each stage at least one further tunable OTA is connected in parallel to the tunable OTA. It is further possible that several further tunable OTAs are connected in parallel to the tunable OTA. The at least one further OTA is connected to the OTA via switches. This means, the further OTA can be connected to the OTA and can be disconnected from the OTA via the switches. The at least one further OTA can be employed to further tune the transconductance of the respective stage. For tuning the transconductance of a stage one or more OTAs can be connected to the OTA. Tuning of the total transconductance of the stages advantageously enables an equalization of the performance parameters of the different stages. By employing at least one further OTA the range within which the respective transconductance can be tuned is increased.

According to at least one embodiment of the circuit arrangement, each stage is configured to receive current pulses generated by a photon detector. Each stage can be configured to receive current pulses generated by one pixel of a photon detector, respectively. Each stage can further be configured to convert the received current pulses into voltage pulses. In this way, the circuit arrangement can be employed in photon counting.

Furthermore, an imaging device is provided. The imaging device comprises the circuit arrangement described herein. The imaging device can be a spectral imaging device or a medical imaging device or a security scanner. The imaging device is a photon counting device. By employing the circuit arrangement in the imaging device advantageously image artifacts can be avoided and the imaging device can be operated efficiently.

According to at least one embodiment of the imaging device, the imaging device comprises a photon detector and for each stage a pixel of the photon detector is connected to the amplifier input of the OTA, respectively. The photon detector is configured to detect single photons. The photon detector can be an optical sensor. The photon detector comprises a plurality of pixels. Each pixel is configured to detect photons. Each stage is connected with one of the pixels, respectively. In this way, each stage is a channel for analyzing the data detected by one of the pixels, respectively. Thus, an increased number of stages increases the resolution of the imaging device. The outputs of the stages are counted individually so that a spectral distribution of the detected photons can be obtained. The imaging device can be employed for single photon counting and it can advantageously be operated efficiently because the circuit arrangement can be operated efficiently.

According to at least one embodiment of the imaging device, an interposer is arranged between the circuit arrangement and the photon detector. The interposer can be a body which connects the circuit arrangement with the photon detector. The interposer can comprise electrical connections that connect the pixels of the photon detector with the stages of the circuit arrangement. The electrical connections can be arranged within the interposer. If the electrical connections do not have the same length for each stage these stages have different input capacitances. Employing an interposer has the advantage that the circuit arrangement does not have to have the same size as the photon detector. In this case the circuit arrangement can be a frontend circuit. Although different input capacitances might be introduced when employing an interposer, the differences in the performance parameters of the different stages can advantageously be balanced by tuning the transconductance the OTAs.

Furthermore, a method for operating a circuit arrangement is provided. The circuit arrangement can preferably be employed for the method for operating a circuit arrangement described herein. This means all features disclosed for the circuit arrangement are also disclosed for the method for operating a circuit arrangement and vice-versa.

According to at least one embodiment of the method for operating a circuit arrangement, the circuit arrangement comprises an array of stages for photon counting current to voltage conversion, each stage comprising a tunable OTA with an amplifier input and an output, and a feedback network connected to the amplifier input and to the output of the OTA thereby forming a feedback loop of the OTA.

The method comprises providing a respective input signal to each stage of the array of stages. The input signal can be provided by an external component. The external component can be a photon detector. For example, each stage is connected with one pixel of the photon detector, respectively. In this case, the input signals are the signals provided by the pixels to the stages. Each input signal can comprise one or more current pulses. Each current pulse can relate to the detection of one photon.

The method further comprises generating, with each stage, an output signal as a function of the respective input signal that is provided to the amplifier input of the respective OTA, wherein the input signal comprises one or more current pulses and the output signal comprises one or more voltage pulses. This means, each stage is configured to convert current pulses into voltage pulses. For each stage the OTA can be configured to convert current pulses into voltage pulses.

The method further comprises providing control voltages to the tunable OTAs, respectively, such that the transconductance of the respective OTA is tuned. The control voltages can be provided to control inputs of the OTAs, respectively. By changing the control voltage the transconductance of the respective OTA can be changed. The method comprises that to each OTA a respective own control voltage can be supplied. This means, the control voltages can be different for different OTAs.

With the method for operating a circuit arrangement the transconductance of the different stages can be tuned. In this way, differences in the input capacitances of the stages can be balanced. This means, the transconductance of the different stages can be tuned in such a way that the bandwidth is the same or approximately the same for all stages. The transconductance of each stage is tuned by tuning the transconductance of the respective OTA. Thus, the differences of the input capacitances can be balanced by tuning the transconductance for each stage. In this way, the performance of the different stages is equalized. The method advantageously further enables that each stage can be operated at its minimum power consumption. Thus, an efficient method for operating a circuit arrangement is provided.

According to at least one embodiment of the method for operating a circuit arrangement, for each stage the transconductance of the OTA is tuned in such a way that the bandwidth of the respective stage is within a predefined range. The bandwidth of a stage depends on the transconductance of the respective stage. Therefore, a change in the transconductance leads to a change in the bandwidth. For an equalization of the performance parameters of the different stages it is desired that all stages have the same or approximately the same bandwidth. This is achieved by tuning the transconductance of the different stages. The predefined range of the bandwidth can be the same for all stages. The predefined range is thus a range within which the bandwidth lies for all stages. The predefined range is chosen such that the resulting performance parameters of stages with a bandwidth within the predefined range are the same or approximately the same. In other words, for each stage the transconductance of the OTA is tuned in such a way that the bandwidth is the same or approximately the same for all stages. It is therefore the goal to achieve the same or approximately the same bandwidth for each stage. This has the advantage that the performance parameters of the different stages are the same or approximately the same and in the case of imaging image artifacts are avoided.

According to at least one embodiment of the method for operating a circuit arrangement, noise is injected to a further input of the OTA by a noise injection block for at least one of the stages. The amount of injected noise depends on the respective input capacitance. It is further possible that noise is injected to the further input of the OTAs by noise injection blocks for a plurality of the stages. With the noise injection block the noise level can be adjusted for each stage separately. This means, for each stage an amount of noise is injected or added in such a way that the noise level is the same or approximately the same for all stages. In this way, the same or a similar noise level for all stages is achieved. This is advantageous for the image quality if the method is employed for imaging.

According to at least one embodiment of the method for operating a circuit arrangement, in a calibration step an input capacitance is determined for each stage. The calibration step is carried out once the circuit arrangement is connected with a photon detector. The input capacitances are introduced by the connections between the circuit arrangement and the photon detector. In further calibration steps the input capacitance can be determined for each stage again after a while of operation of the circuit arrangement. It is necessary to determine the input capacitance for each stage in order to determine how the transconductance can be tuned for each stage in order to achieve an equalization of the performance parameters for the different stages.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

DETAILED DESCRIPTION

Figure 1:
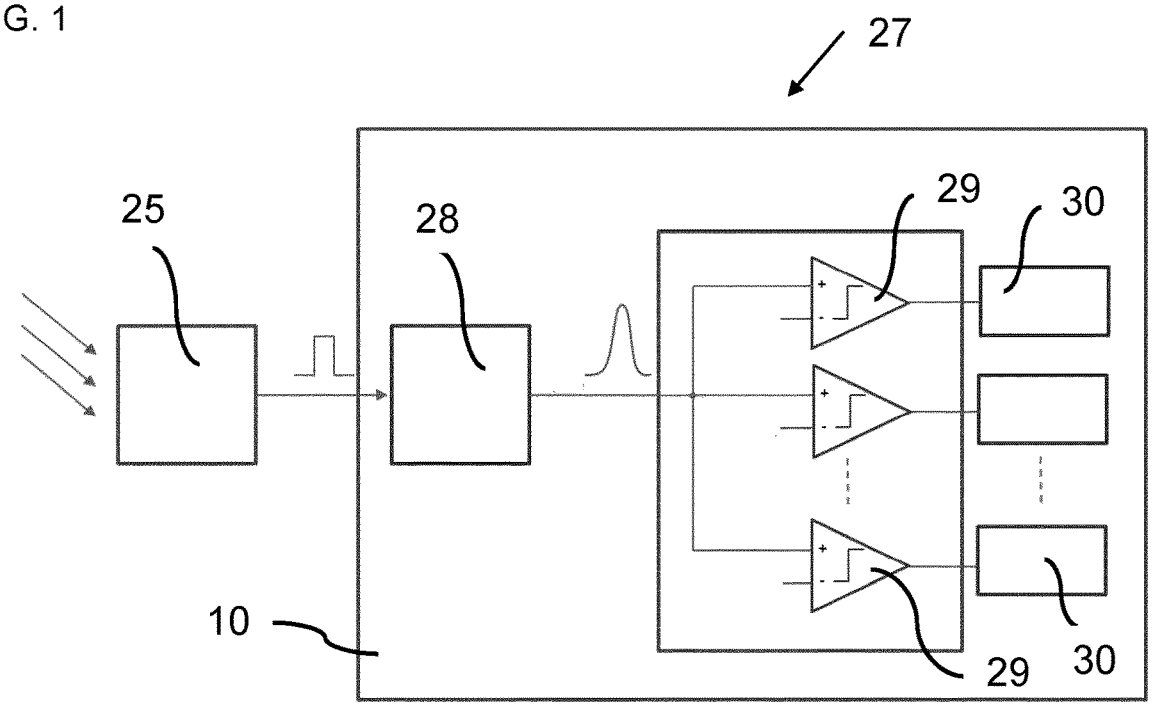
FIG. 1 shows the general setup of a photon counting system.

FIG. 1 shows the setup of a photon counting system 27. A photon detector 25 can be exposed to photons and it is configured to detect photons. The photon detector 25 is configured to provide one or more current pulses to a circuit arrangement 10 in response to the detection of photons. One current pulse is schematically depicted between the photon detector 25 and the circuit arrangement 10. A frontend circuit 28 of the circuit arrangement 10 is configured to convert the one or more current pulses into one or more voltage pulses. The one or more voltage pulses are provided to a network of comparators 29 that constitute an analog-to-digital converter (ADC). One voltage pulse is schematically depicted between the frontend circuit 28 and the comparators 29. The ADC comprises a plurality of comparators 29. Each comparator 29 is configured to convert analog signals into digital signals. It depends on the peak voltage of a voltage pulse provided by the frontend circuit 28 which of the comparators 29 will trigger. This means, each of the comparators 29 is assigned to a different voltage range. In this way, the voltage pulses can be counted in dependence of their peak voltage. For this purpose, the output of each comparator 29 is connected to a counter 30. Thus, spectral information can be obtained with the circuit arrangement 10.

Figure 2:
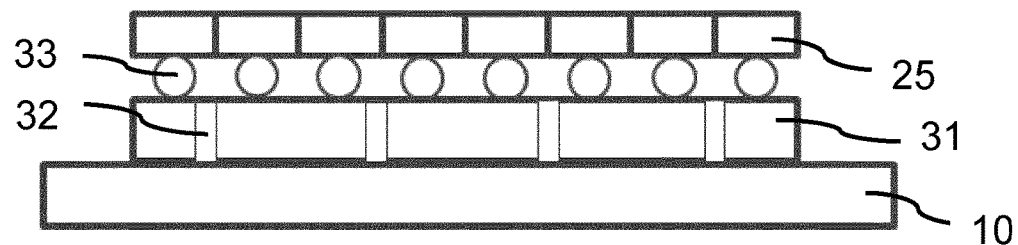
FIGS. 2 and 3 show possibilities for the arrangement of a sensor on a frontend circuit.

FIG. 2 shows a possible connection of a photon detector 25 with a circuit arrangement 10. On the circuit arrangement 10 an integrated circuit 31 with through-silicon vias 32 is arranged. The through-silicon vias 32 extend through the integrated circuit 31 and provide electrical contacts of supply and input/output pads to the bottom. Above the integrated circuit 31 the photon detector 25 is arranged. The photon detector 25 is directly electrically connected via electrical connections 33.

Figure 3:
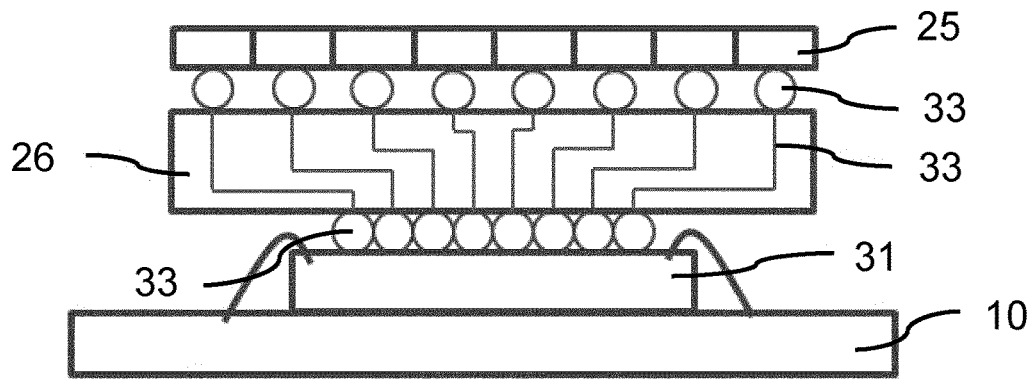

FIG. 3 shows another possible connection of a photon detector 25 with a circuit arrangement 10. On the circuit arrangement 10 an integrated circuit 31 is arranged. On the integrated circuit 31 electrical connections 33 are arranged. On the electrical connections 33 an interposer 26 is arranged. The photon detector 25 is arranged above the interposer 26 and is connected to the interposer 26 via electrical connections 33. Within the interposer 26 electrical connections 33 are arranged that connect the photon detector 25 with the circuit arrangement 10 via the surrounding electrical connections 33. For different parts of the photon detector 25 the electrical connections 33 within the interposer 26 have different lengths.

Figure 4:
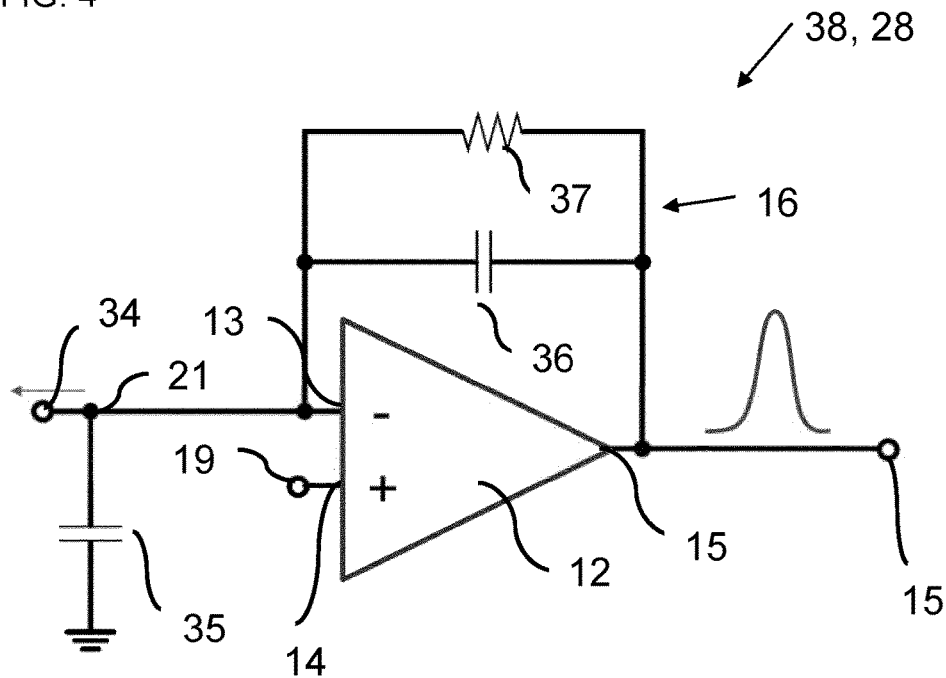
FIGS. 4 and 5 show circuits for photon counting.

FIG. 4 shows a circuit 38 for photon counting which is no embodiment. The circuit 38 is a frontend circuit 28 for photon counting. The circuit 38 comprises an input 34 at which an input current can be received. The circuit 38 can have an input capacitance $C_{in}$ which represented by an input capacitor 35 connected to a first internal node 21. The first internal node 21 is connected to the input 34 and to an amplifier input 13 of an OTA 12. A further input 14 of the OTA 12 is connected to a reference potential terminal 19. The OTA 12 is configured to convert current pulses received at its amplifier input 13 into voltage pulses that are provided at an output 15 of the OTA 12. One voltage pulse is schematically depicted at the output 15 of the OTA 12. The circuit 38 further comprises a feedback network 16. The feedback network 16 comprises a feedback capacitor 36 and a resistor 37. The feedback capacitor 36 is connected to the output 15 of the OTA 12 and to the amplifier input 13 of the OTA 12. The resistor 37 is connected parallel to the feedback capacitor 36. At an output 15 of the circuit 38 one or more voltage pulses can be provided. For the circuit 38 the peaking time, gain and noise directly depend on the input capacitance $C_{in}$.

Figure 5:
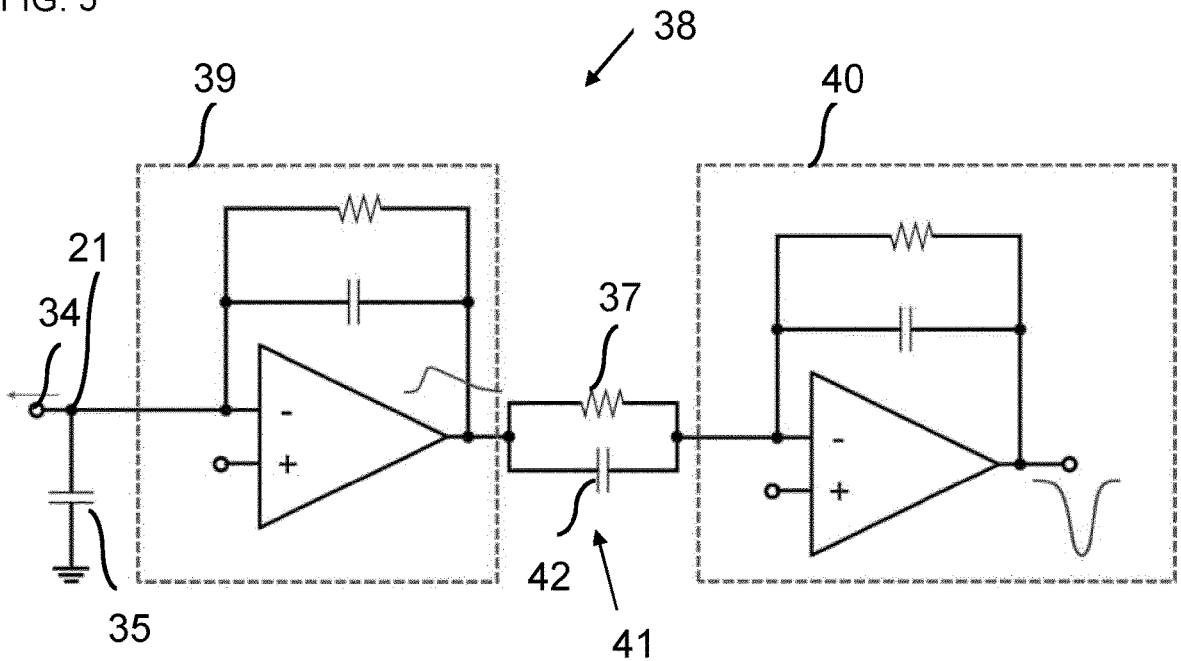

FIG. 5 shows another circuit 38 for photon counting which is no embodiment. The circuit 38 comprises an input 34 at which one or more current pulses can be received. The circuit 38 can have an input capacitance $C_{in}$ Which is represented by an input capacitor 35 connected to a first internal node 21. The first internal node 21 is connected to the input 34 and to a first circuit element 39 of the circuit 38. The first circuit element 39 has the setup shown in FIG. 4. The first circuit element 39 is a charge sensitive amplifier. The circuit 38 further comprises a second circuit element 40 which has the setup shown in FIG. 4. Between the first circuit element 39 and the second circuit element 40 a passive coupling network 41 is arranged. The passive coupling network 41 comprises a resistor 37 that is connected parallel to a capacitor 42. By employing the passive coupling network 41 the input capacitance $C_{in}$ is buffered and the second circuit element 40 is decoupled from the input capacitance $C_{in}$. In this way, the impact of the input capacitance $C_{in}$ on the performance parameters of the second circuit element 40 is reduced. However, the noise level of the circuit 38 still depends on the input capacitance $C_{in}$.

Figure 6:
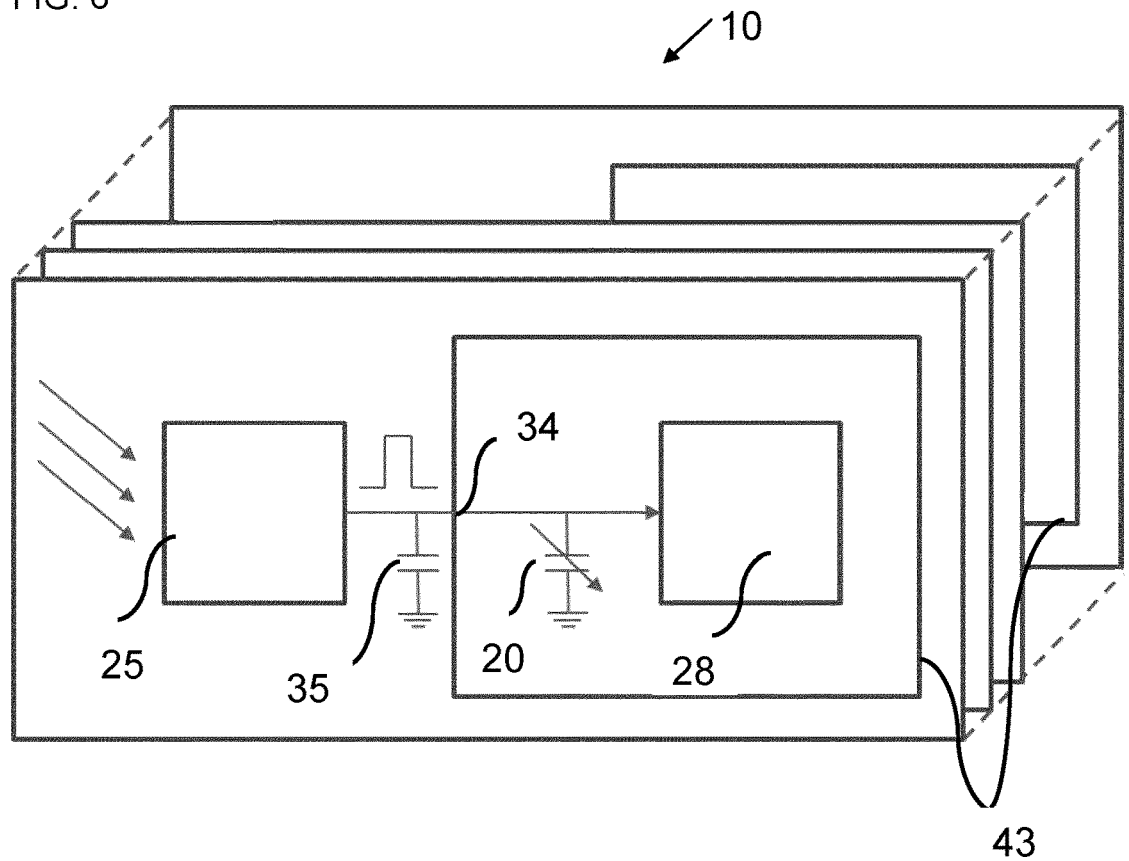
FIG. 6 shows a circuit arrangement known from prior art.

FIG. 6 shows a circuit arrangement 10 known from prior art, for example from US20180372887 A1. The circuit arrangement 10 comprises a plurality of channels 43. Each channel 43 is connected to a pixel of a photon detector 25. Each channel 43 comprises a frontend circuit 28. Because of the electrical connection between the photon detector 25 and the frontend circuit 28 an input capacitance $C_{in}$ is introduced which is represented by an input capacitor 35. The circuit arrangement 10 comprises a tunable capacitor 20 for each channel 43. This means, to the input 34 of each frontend circuit 28 a tunable capacitor 20 is connected. The capacitance of the tunable capacitor 20 is adjusted in such a way that for each channel 43 the sum of the input capacitance $C_{in}$ and the capacitance of the tunable capacitor 20 is equal. Thus, for each frontend circuit 28 the total input capacitance $C_{in}$ is equal. This leads to an equalization of the performance parameters of different circuits. However, the power consumption is increased as the worst input capacitance $C_{in}$ is employed for all channels 43. Furthermore, additional non-ideality can be introduced by the tunable capacitors 20.

Figure 7:
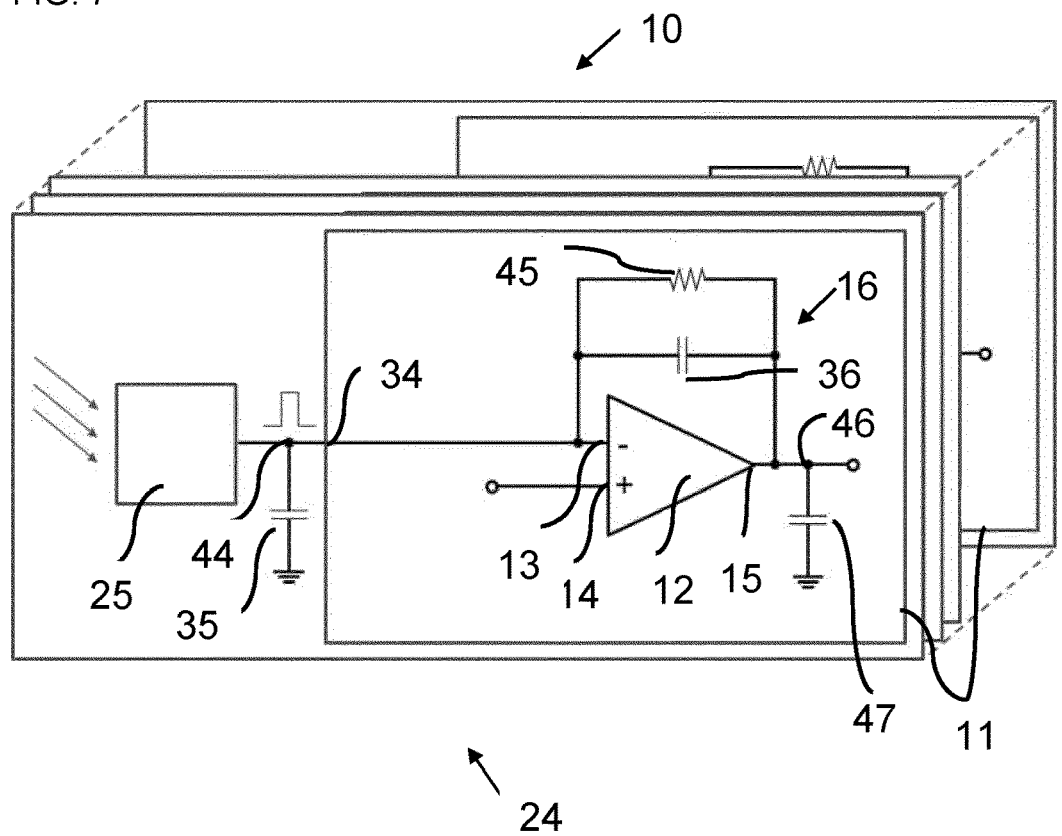
FIG. 7 shows an exemplary embodiment of a circuit arrangement and an exemplary embodiment of an imaging device.

FIG. 7 shows an exemplary embodiment of a circuit arrangement 10. The circuit arrangement 10 comprises an array of stages 11 for photon counting current to voltage conversion. The stages 11 can be connected parallel to each other. Each stage 11 comprises an input 34 that is connected to a pixel of a photon detector 25. This means, each stage 11 is configured to receive current pulses generated by the photon detector 25. Each stage 11 can be connected to its own pixel of the photon detector 25. The pixels are configured to receive photons and to generate one or more current pulses in response to receiving a photon. For each stage 11 the respective pixel is connected to an input node 44. The input node 44 is further connected to the input 34 of the respective stage 11. One current pulse is schematically depicted at the input node 44. In addition, an input capacitance $C_{in}$ is introduced by the connection between the photon detector 25 and the circuit arrangement 10. This input capacitance $C_{in}$ is represented in FIG. 7 by an input capacitor 35 connected to the input node 44.

Each stage 11 comprises a tunable OTA 12 comprising an amplifier input 13, a further input 14 and an output 15. Furthermore, each stage 11 comprises a feedback network 16 that is connected to the amplifier input 13 and to the output 15 of the OTA 12 thereby forming a feedback loop of the OTA 12. The feedback network 16 comprises a feedback capacitor 36 and a transconductance feedback element 45. The feedback capacitor 36 is connected to the amplifier input 13 and to the output 15 of the OTA 12. The transconductance feedback element 45 is connected parallel to the feedback capacitor 36. The transconductance feedback element 45 can be a transconductor or a resistor. The feedback loop can be configured to provide feedback from the output 15 of the OTA 12 to the amplifier input 13.

For each stage 11 the tunable OTA 12 is configured to be supplied with a control voltage, where by changing the control voltage the transconductance $g_m$ of the respective OTA 12 can be tuned. In this way, the transconductance $g_m$ of a stage 11 can be tuned or adjusted.

The output 15 of the OTA 12 is connected to a second internal node 46. The second internal node 46 is connected to an output 15 of the respective stage 11 and to a load capacitor 47.

Each stage 11 is configured to provide an output signal as a function of an input signal that is provided to the amplifier input 13 of the OTA 12, wherein the input signal comprises one or more current pulses and the output signal comprises one or more voltage pulses.

For each stage 11 a variation in the input capacitance $C_{in}$ has an impact on the feedback factor β which is for higher frequencies is given by $$\beta \approx \frac{C_{fb}}{C_{in} + C_{fb}} \approx \frac{C_{fb}}{C_{in}} \text{ for } C_{in} \gg C_{fb}$$

where $C_{fb}$ is the capacitance of the feedback capacitor 36 and $C_{in}$ is the input capacitance.

The bandwidth BW of a stage 11 has impact on the peaking time and the gain and is given by $$Bw = \frac{g_m}{C_l} \beta$$

where $g_m$ is the transconductance of the respective stage 11 and $C_l$ is the capacitance of the load capacitor 47. Thus, by tuning the transconductance $g_m$ of the stages 11 the different input capacitances $C_{in}$ can be balanced. In this way, an equalization of the performance parameters of the different stages 11 is achieved.

The setup of the circuit arrangement 10 shown in FIG. 7 can be employed in both of the setups shown in FIG. 4 and FIG. 5.

The circuit arrangement 10 of FIG. 7 can be employed for a method for operating a circuit arrangement 10. The method comprises providing a respective input signal to each stage 11 of the array of stages 11. Furthermore, with each stage 11 an output signal is generated as a function of the respective input signal that is provided to the amplifier input 13 of the respective OTA 12. In order to tune the transconductance $g_m$ of the respective OTAs 12 control voltages are provided to the OTAs 12, respectively. For each stage 11 the transconductance $g_m$ of the OTA 12 is tuned in such a way that the bandwidth of the respective stage 11 is within a predefined range. In a calibration step the input capacitance) $C_{in}$ is determined for each stage 11.

FIG. 7 further shows an exemplary embodiment of an imaging device 24. The imaging device 24 can be a spectral imaging device or a medical imaging device. The imaging device 24 comprises the circuit arrangement 10 and the photon detector 25. For each stage 11 a pixel of the photon detector 25 is connected to the amplifier input 13 of the OTA 12, respectively.

Figure 8:
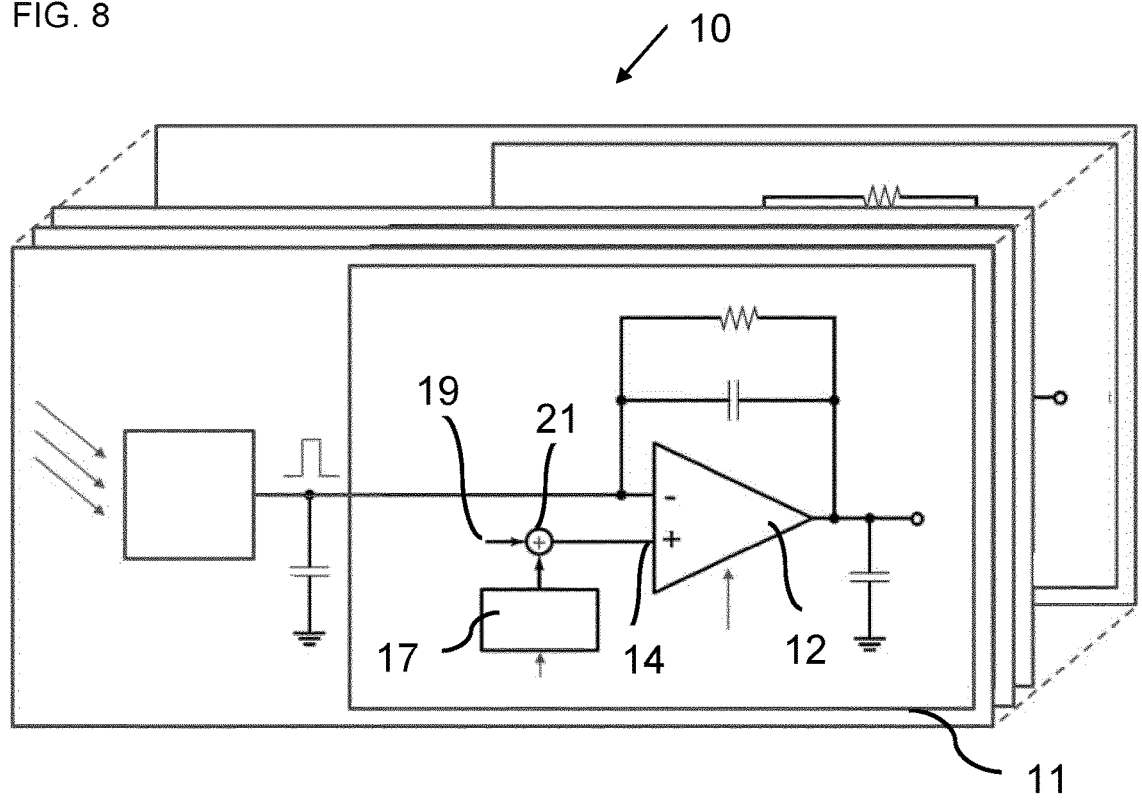
FIGS. 8 and 9 show further exemplary embodiments of the circuit arrangement.

In FIG. 8 another exemplary embodiment of the circuit arrangement 10 is shown. The circuit arrangement 10 shown in FIG. 8 has the same setup as shown in FIG. 7 except for an additional noise injection block 17. Each stage 11 comprises a noise injection block 17 that is connected to the further input 14 of the OTA 12. For each stage 11 the noise injection block 17 is connected to the further input 14 of the OTA 12 via a first internal node 21. The first internal node 21 is arranged between a reference potential terminal 19 and the further input 14 of the OTA 12.

The output noise $V_n$ of a stage 11 is given by $$V_n = \sqrt{k \frac{C_{in}}{C_i C_{fb}}}$$

where k is a constant. The output noise thus depends on the input capacitance $C_{in}$ and it is independent from the transconductance $g_m$. Therefore, for an equalization of the noise level noise injection blocks 17 are employed. Noise can be injected to the further input 14 of the OTA 12 by a noise injection block 17 for at least one of the stages 11.

Figure 9:
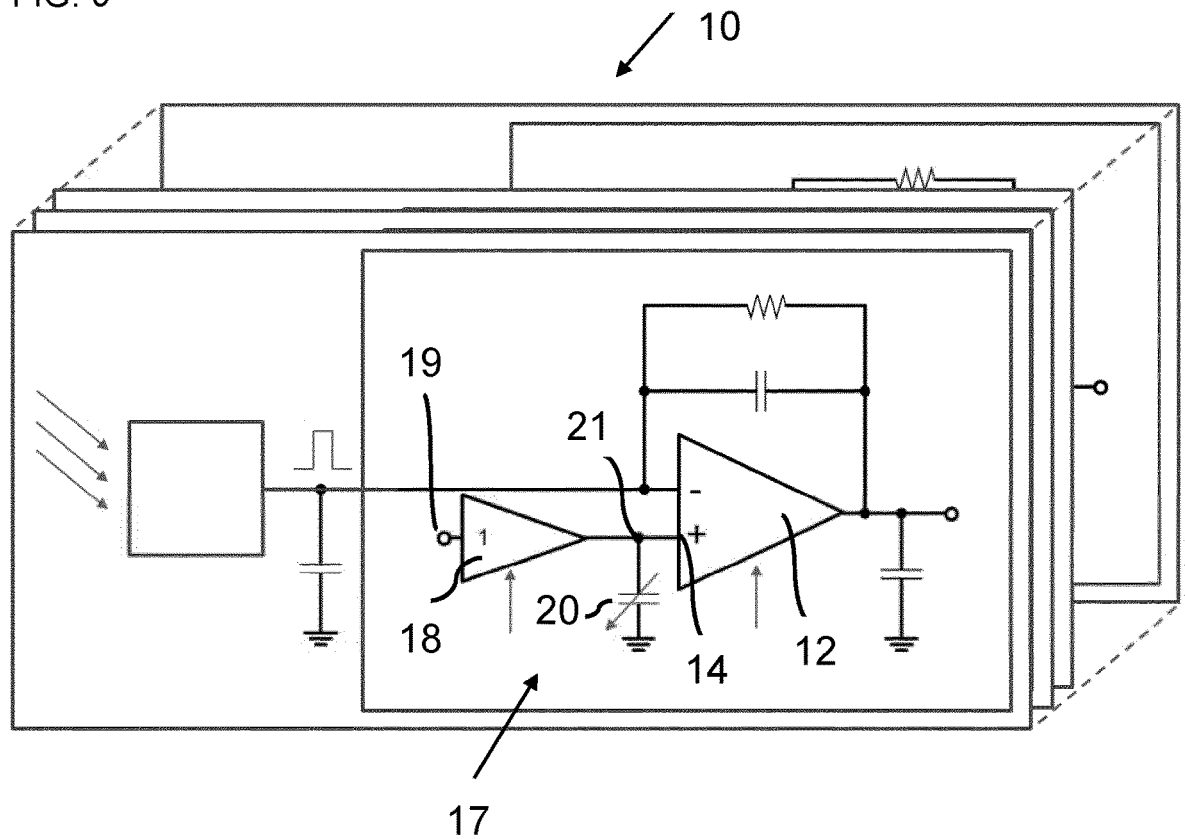

FIG. 9 shows another exemplary embodiment of the circuit arrangement 10. The circuit arrangement 10 has the same setup as shown in FIG. 8 with the only difference that the setup of the noise injection block 17 is further specified. The noise injection block 17 comprises a buffer component 18 and a tunable capacitor 20. The buffer component 18 and the tunable capacitor 20 are both connected to the first internal node 21 which is arranged between the buffer component 18 and the further input 14 of the OTA 12. The buffer component 18 has a tunable noise level and it is arranged between the reference potential terminal 19 and the first internal node 21. The transconductance $g_m$ and the noise level of the buffer component 18 can be tuned.

Figure 10:
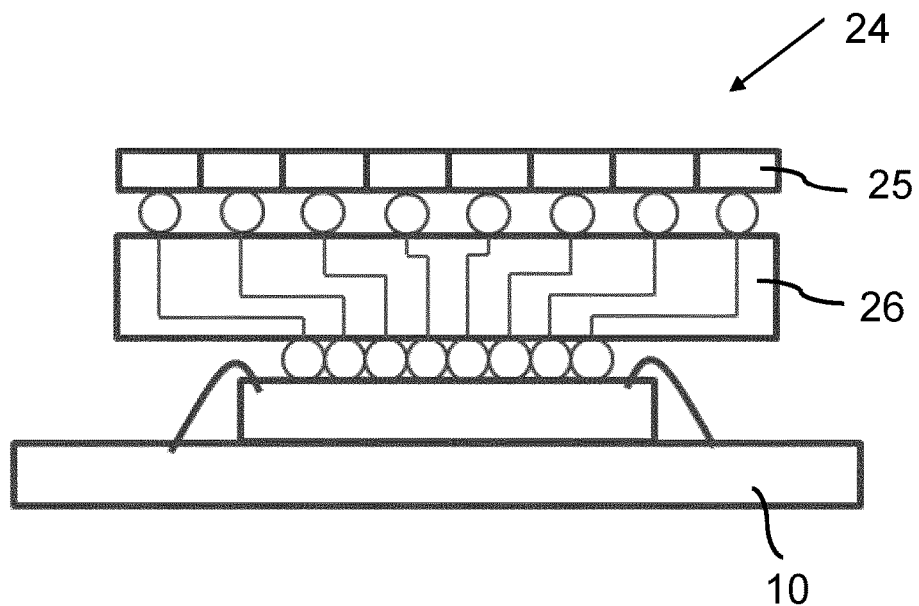
FIG. 10 shows another exemplary embodiment of the imaging device.

FIG. 10 shows another exemplary embodiment of the imaging device 24. In this embodiment an interposer 26 is arranged between the circuit arrangement 10 and the photon detector 25.

Figure 11:
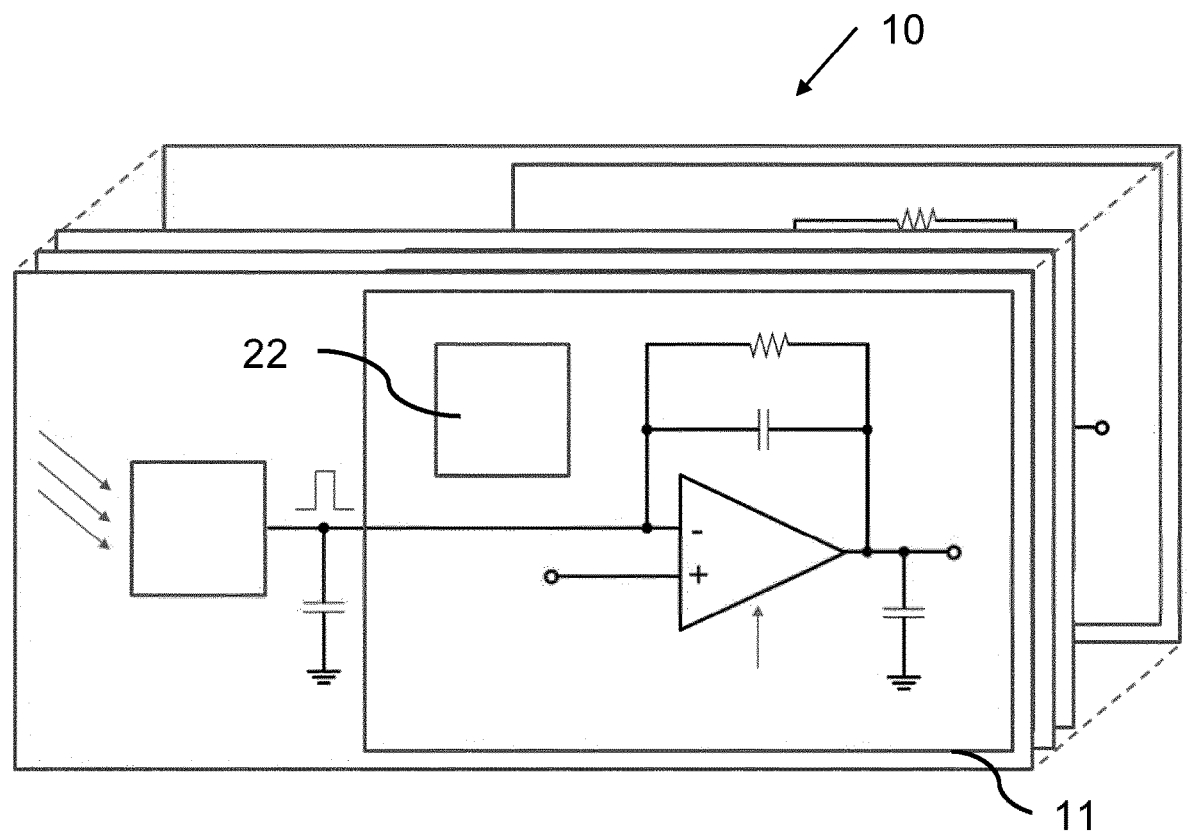
FIGS. 11 and 12 show further exemplary embodiments of the circuit arrangement.

FIG. 11 shows another exemplary embodiment of the circuit arrangement 10. In comparison to the circuit arrangement 10 shown in FIG. 7 the circuit arrangement 10 of FIG. 11 further comprises a plurality of heaters 22, where each heater 22 is assigned to one of the stages 11, respectively. The heaters 22 are arranged in close proximity to the respective stages 11.

Figure 12:
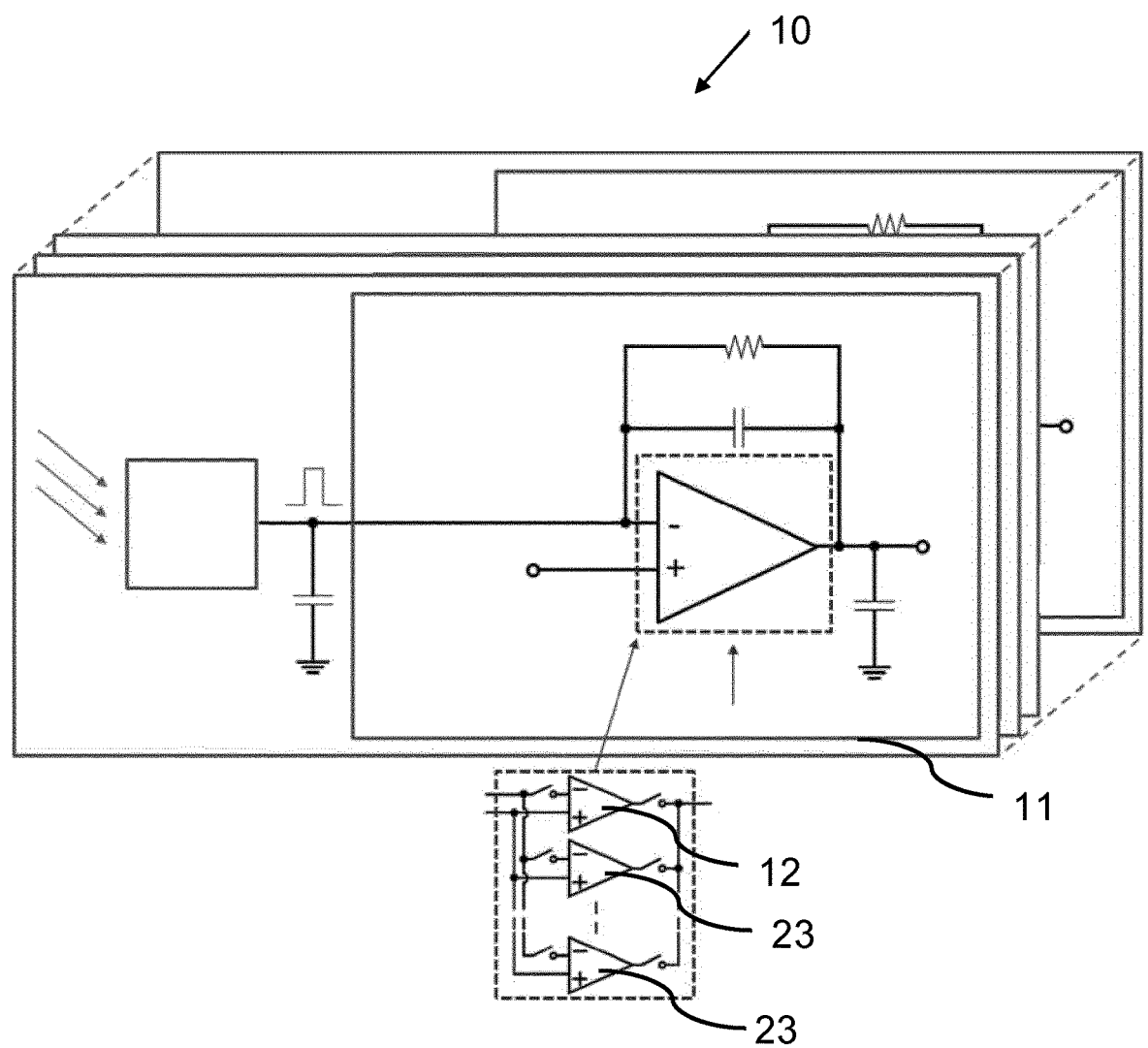

FIG. 12 shows another exemplary embodiment of the circuit arrangement 10. In comparison to the circuit arrangement 10 shown in FIG. 7 the circuit arrangement 10 of FIG. 12 further comprises at least one further tunable OTA 23 for each stage 11 where the further tunable OTA 23 is connected in parallel to the tunable OTA 12. The circuit arrangement 10 can comprise several further tunable OTAs 23 which is indicated by dashed lines in FIG. 12. The at least one further OTA 23 can be employed to further tune the transconductance $g_m$ of the respective stage 11.

It will be appreciated that the disclosure is not limited to the disclosed embodiments and to what has been particularly shown and described hereinabove. Rather, features recited in separate dependent claims or in the description may advantageously be combined. Furthermore, the scope of the disclosure includes those variations and modifications, which will be apparent to those skilled in the art. The term "comprising", insofar it was used in the claims or in the description, does not exclude other elements or steps of a corresponding feature or procedure. In case that the terms "a" or "an" were used in conjunction with features, they do not exclude a plurality of such features. Moreover, any reference signs in the claims should not be construed as limiting the scope.

The invention claimed is:

1. A circuit arrangement comprising:
   an array of stages for photon counting current to voltage conversion, wherein each stage comprises:
   a tunable operational transconductance amplifier comprising an amplifier input and an output, and
   a feedback network that is connected to the amplifier input and to the output of the operational transconductance amplifier thereby forming a feedback loop of the operational transconductance amplifier, wherein
   for each stage the tunable operational transconductance amplifier is configured to be supplied with a control voltage at a control input, where by changing the control voltage the transconductance of the respective operational transconductance amplifier can be tuned.

2. The circuit arrangement according to claim 1, wherein for each stage a noise injection block is connected to a further input of the operational transconductance amplifier.

3. The circuit arrangement according to claim 2, wherein each noise injection block comprises a buffer component with tunable noise level that is arranged between a reference potential terminal and the further input of the respective operational transconductance amplifier.

4. The circuit arrangement according to claim 3, wherein each noise injection block comprises a tunable capacitor that is connected to a first internal node arranged between the buffer component and the further input of the respective operational transconductance amplifier.

5. The circuit arrangement according to claim 1, wherein the circuit arrangement further comprises a plurality of heaters, where each heater is assigned to one of the stages, respectively.

6. The circuit arrangement according to claim 1, wherein for each stage at least one further tunable operational transconductance amplifier is connected in parallel to the tunable operational transconductance amplifier.

7. The circuit arrangement according to claim 1, wherein each stage is configured to receive current pulses generated by a photon detector.

8. An imaging device comprising the circuit arrangement according to claim 1, wherein the imaging device is in particular a spectral imaging device or a medical imaging device.

9. The imaging device according to claim 8, wherein the imaging device comprises a photon detector and for each stage a pixel of the photon detector is connected to the amplifier input of the operational transconductance amplifier, respectively.

10. The imaging device according to claim 9, wherein an interposer is arranged between the circuit arrangement and the photon detector.

11. A method for operating a circuit arrangement that comprises an array of stages for photon counting current to voltage conversion, each stage comprising a tunable operational transconductance amplifier with an amplifier input and an output, and a feedback network connected to the amplifier input and to the output of the operational transconductance amplifier thereby forming a feedback loop of the operational transconductance amplifier, the method comprising:

supplying for each stage the tunable operational transconductance amplifier with a control voltage at a control input, where by changing the control voltage the transconductance of the respective operational transconductance amplifier can be tuned.

12. The method according to claim 11, wherein for each stage the transconductance of the operational transconductance amplifier is tuned in such a way that the bandwidth of the respective stage is within a predefined range.

13. The method according to claim 11, wherein noise is injected to a further input of the operational transconductance amplifier by a noise injection block for at least one of the stages.

14. The method according to claim 11, wherein in a calibration step an input capacitance is determined for each stage.

* * * * *